United States Patent
Tanaka

(10) Patent No.: US 8,021,488 B2
(45) Date of Patent: Sep. 20, 2011

(54) SEALING STRUCTURE OF VACUUM DEVICE

(75) Inventor: Keiichi Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 781 days.

(21) Appl. No.: 11/951,635

(22) Filed: Dec. 6, 2007

(65) Prior Publication Data

US 2008/0088097 A1   Apr. 17, 2008

Related U.S. Application Data

(63) Continuation of application No. PCT/JP2006/311429, filed on Jun. 7, 2006.

(30) Foreign Application Priority Data

Jun. 8, 2005 (JP) .................................. 2005-168231

(51) Int. Cl.
    *C23C 16/00* (2006.01)
(52) U.S. Cl. ........................................................ 118/733
(58) Field of Classification Search ..................... 118/733
    See application file for complete search history.

(56) References Cited

U.S. PATENT DOCUMENTS

| | | | | |
|---|---|---|---|---|
| 4,427,378 A | * | 1/1984 | Bowers | 432/242 |
| 4,755,244 A | | 7/1988 | Allison | |
| 5,207,573 A | * | 5/1993 | Miyagi et al. | 432/182 |
| 5,497,727 A | * | 3/1996 | Mayeda et al. | 118/733 |
| 5,578,132 A | | 11/1996 | Yamaga et al. | |
| 5,942,038 A | * | 8/1999 | Mayeda et al. | 118/719 |
| 6,095,083 A | * | 8/2000 | Rice et al. | 118/723 I |
| 6,142,773 A | * | 11/2000 | Shimazu | 432/241 |
| 6,258,170 B1 | * | 7/2001 | Somekh et al. | 118/715 |
| 7,651,568 B2 | * | 1/2010 | Ishizaka et al. | 118/715 |
| 7,808,781 B2 | * | 10/2010 | Colgan et al. | 361/699 |
| 2008/0088097 A1 | * | 4/2008 | Tanaka | 277/650 |

FOREIGN PATENT DOCUMENTS

| | | |
|---|---|---|
| CN | 2277007 Y | 3/1998 |
| JP | 61-171965 A | 8/1986 |
| JP | 61-211572 A | 9/1986 |
| JP | 61-294267 A | 12/1986 |
| JP | 07-058048 A | 3/1995 |
| JP | 2000-106298 A | 4/2000 |

* cited by examiner

*Primary Examiner* — Jeffrie R Lund

(74) *Attorney, Agent, or Firm* — Oblon, Spivak, McClelland, Maier & Neustadt, L.L.P.

(57) ABSTRACT

A sealing structure for sealing a gap between a vacuum container 2 and a lid 3 contacted to an opening of the vacuum container 2 to close it. A cavity 66 is formed in an elastomer O-ring 64 interposed between the vacuum container 2 and the lid 3, and a cooling pipe 65 is inserted in the cavity 66. The O-ring is cooled by circulating coolant in the cooling pipe 65. Since permeability of gas in a solid depends on a temperature, the amount of gas permeating the O-ring 64, especially oxygen, can be reduced by cooling the O-ring 64, thus maintaining a vacuum level in the vacuum container 2 at a high level. Since the O-ring 64 is cooled from its inside, only the O-ring 64 can be cooled locally without influencing temperature controls at other parts of the vacuum device.

15 Claims, 5 Drawing Sheets

SEALING STRUCTURE OF VACUUM DEVICE

CROSS-REFERENCE TO RELATED APPLICATIONS

This application is a Continuation Application of PCT/JP2006/311429 filed on Jun. 7, 2006, which is based upon and claims benefit of priority from Japanese Patent Application No. 2005-168231, filed Jun. 8, 2005, the entire contents of each of which are incorporated herein by reference.

FIELD OF THE INVENTION

The present invention relates to a sealing structure of a vacuum device; and, more particularly, to a sealing structure suitable for a vacuum processing apparatus for use in manufacturing a semiconductor device, such as a film forming apparatus, a heat treatment apparatus, or the like.

BACKGROUND OF THE INVENTION

In a manufacturing process of a semiconductor device, various heat treatment processes such as a film forming process, a pattern etching process, an oxidation/diffusion process, a quality modification process, an annealing process and the like are repeatedly performed.

As an example of a heat treatment apparatus, Japanese Patent Laid-open Application No. 2002-327274 discloses an apparatus for forming a thin film on a surface of a semiconductor wafer serving as a target object through a gas phase chemical reaction, i.e. a CVD (Chemical Vapor Deposition) apparatus. The CVD apparatus includes a vacuum container with a heater, and the vacuum container has a stage for mounting a wafer thereon and a shower head disposed above the stage to face it. The heater is buried in the stage. In the process, the vacuum container is vacuum-evacuated to a specific vacuum level, the semiconductor wafer is heated to a specific temperature by heating the stage, and a $TiCl_4$ gas and a $H_2$ gas serving as a processing gas are supplied from the shower head and converted into a plasma. By using the plasma, a Ti thin film is formed on the surface of the semiconductor wafer. In this case, a hot wall process is employed to prevent $TiCl_4$ (source material) and $NH_4Cl$ (reaction by-product) from being attached to a sidewall of the vacuum container.

In general, the vacuum container has an opening port at a top portion thereof and the opening port is closed by a lid. A sealing member is interposed between the opening port of the vacuum container and the lid to air-tightly seal a gap therebetween. An O-ring is used as the sealing member considering the ease of repair and maintenance and cost. The O-ring is generally made of elastomer with excellent heat and corrosion resistance, e.g., fluoroelastomer or perfluoroelastomer.

If an undesirable external gas, e.g., oxygen, leaks into the vacuum container during the film forming process, a vacuum level inside the vacuum container is lowered, thereby causing an adverse effect on the film forming reaction. In order to prevent this, a sealing structure to block such an undesirable gas leakage is required.

The gas enters into the vacuum container by permeating through the sealing member, and permeability of a gas in a solid is a function of a temperature of the solid. To be specific, the amount of the permeating gas decreases with a decrease of the temperature, whereas the amount of the permeating gas increases as the temperature rises. Thus, cooling the sealing member can be considered as one of possible schemes to reduce the amount of the permeating gas. Alternatively, metal with a low gas permeability can be used as the sealing member instead of elastomer.

However, in order to cool the sealing member (especially the elastomer O-ring) in case of performing the hot wall process, the walls of the vacuum container need to be heated to a specific temperature (e.g., 170° C.) while only the part where the sealing member is disposed in the walls of the vacuum container needs to be cooled. Accordingly, it is difficult to control the temperature.

Further, the metallic sealing member that secures sealing performance based on elastic deformation is plastically deformed by the repeated expansion and contraction caused by the repetition of the rise and fall of the temperature, which deteriorates the sealing performance which can be achieved by elastic deformation. Furthermore, if the material of the sealing member is different from that of the walls of the vacuum container, a sealing surface can be damaged during its expansion and contraction due to the thermal expansion coefficient difference therebetween, thereby resulting in deterioration of the sealing performance. Moreover, the metallic sealing member is more expensive than the elastomer sealing member and cannot be reused. Accordingly, the metallic sealing member is not suitable for the above-described use.

SUMMARY OF THE INVENTION

It is, therefore, an object of the present invention to provide a relatively simple sealing structure capable of achieving reliable sealing by reducing the amount of the gas (especially oxygen) permeating through a sealing member.

In accordance with an aspect of the present invention, there is provided a sealing structure of a vacuum device including:

a vacuum container for accommodating therein a target object;

a closing member for closing an opening port of the vacuum container; and a ring-shaped sealing member made of elastomer, which is interposed between the vacuum container and the closing member in an elastically deformed state to airtightly seal a gap between the vacuum container and the closing member, wherein a cavity is formed in the sealing member along a circumferential direction thereof, and a cooling pipe in which a coolant circulates is inserted in the cavity.

Preferably, a slit is formed at the sealing member to attach or detach the cooling pipe to or from the sealing member.

Preferably, the sealing member is made of a fluorine resin.

Preferably, the sealing structure of the present invention further includes another ring-shaped sealing member, in which a cooling pipe is not inserted, said another ring-shaped sealing member being interposed between the vacuum container and the closing member and arranged closer to an inner space of the vacuum container than the sealing member, in which the cooling pipe is inserted, is.

Preferably, in accordance with an embodiment of the present invention, the sealing member in which the cooling pipe is inserted and the sealing member in which a cooling pipe is not inserted are, respectively, accommodated in two ring-shaped grooves formed in the sealing member or the closing member, and the ring-shaped grooves are partitioned from each other by a partition wall.

DETAILED DESCRIPTION OF THE EMBODIMENTS

Hereinafter, embodiments of the present invention will be described in detail with reference to the accompanying drawings.

Figure 1:
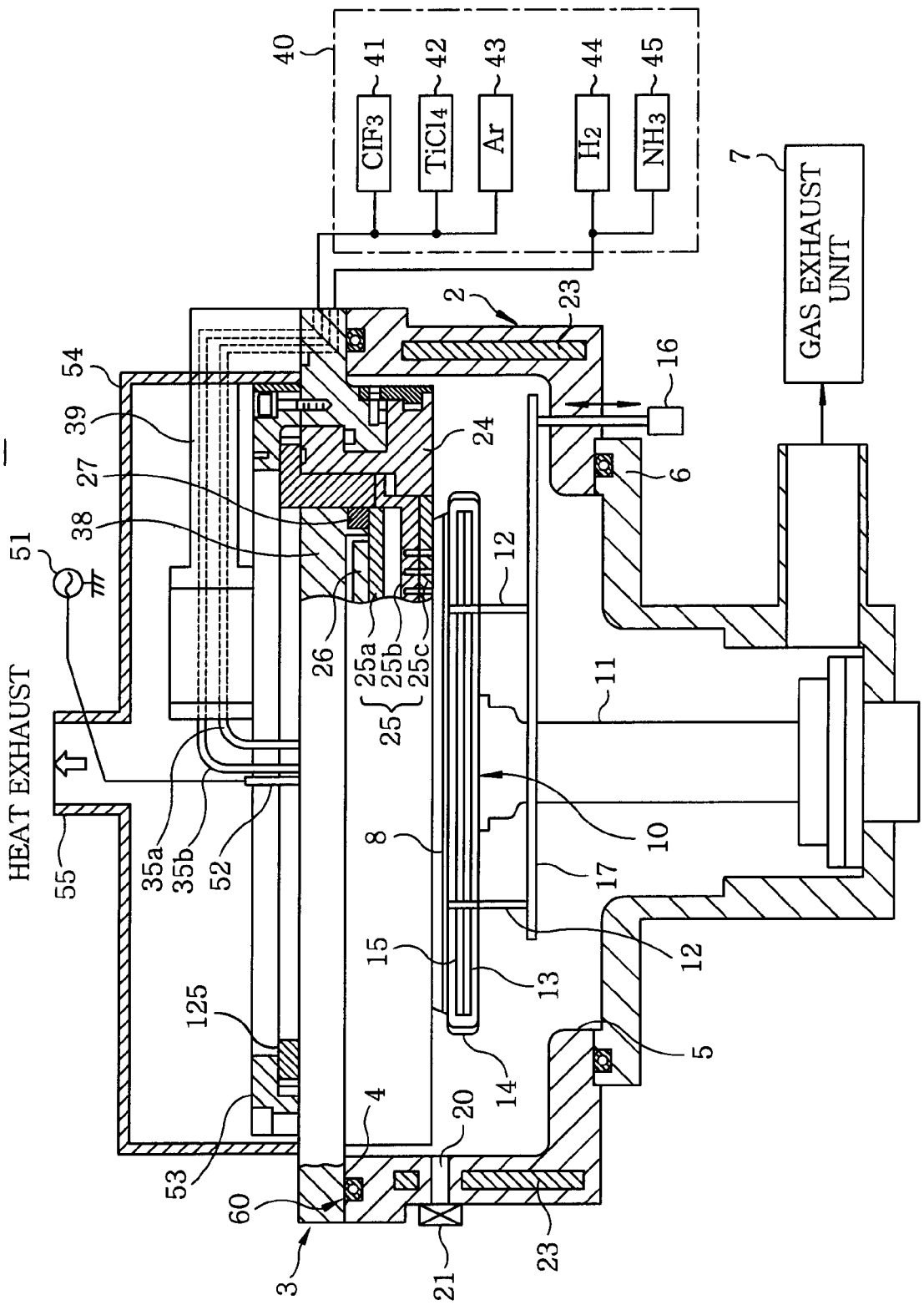
FIG. 1 illustrates a cross sectional view of a CVD film forming apparatus (vacuum device) having a sealing structure in accordance with a first embodiment of the present invention.
Figure 2:
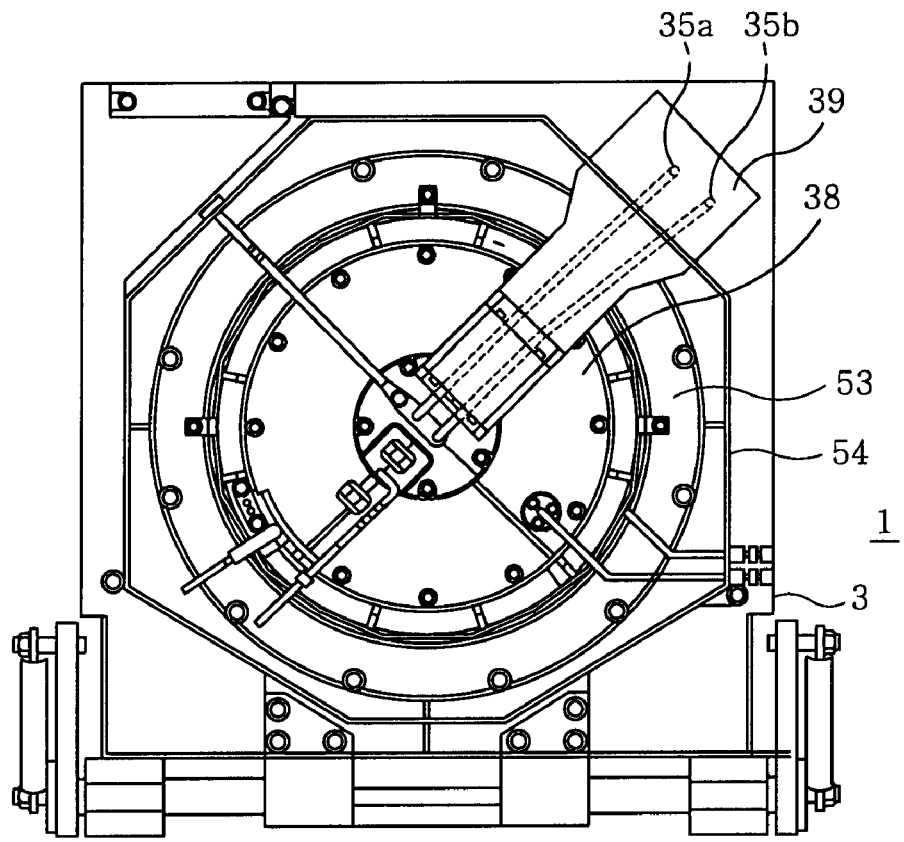
FIG. 2 illustrates a plan view of an upper portion of a shower head of the CVD film forming apparatus shown in FIG. 1.
Figure 3:
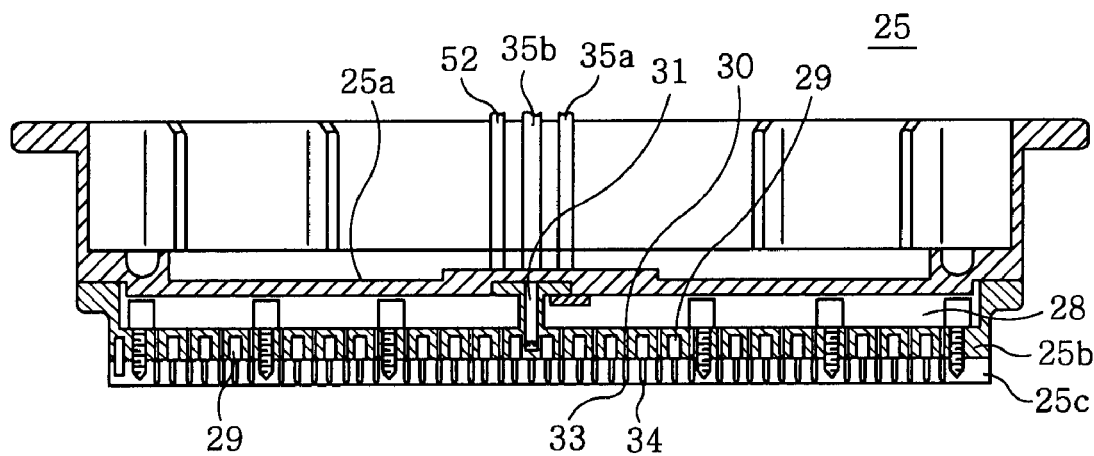
FIG. 3 illustrates a cross sectional view of the shower head of FIG. 2.

FIGS. 1 to 3 show a CVD film forming apparatus for forming a Ti thin film as an exemplary vacuum device to which a sealing structure in accordance with the present invention is applied. The CVD film forming apparatus 1 includes a substantially cylindrical chamber (vacuum container) 2 having opening ports 4 and 5 at an upper and a lower portion thereof, respectively, to be open at the upper and the lower portion; and a lid 3 and a stage support member 6 serving as a member closing the upper opening port 4 and the lower opening port 5, respectively. An inner space of the stage support member 6 is connected to a gas exhaust unit 7 for vacuum-evacuating an inside of the chamber 2.

Disposed in the chamber 2 is a stage 10 for horizontally mounting thereon a target object, e.g., a semiconductor wafer (hereinafter, referred to as a "substrate") 8. The stage 10 is formed on a support column 11 vertically installed in the stage support member 6. The stage 10 includes a plurality of vertically movable supporting pins 12 for supporting the substrate 8; a heater 13 for heating the substrate 8; a ring 14 for stabilizing plasma generation; and a mesh electrode 15. The supporting pins 12 are vertically installed on a supporting plate 17 which is vertically movable by an air cylinder 16. The stage 10 is provided with supporting pin insertion through-holes through which the supporting pins 12 are inserted.

Installed at one side of a sidewall of the chamber 2 are a loading/unloading port 20 for transferring the substrate 8 therethrough and a gate valve 21 for opening and closing the loading/unloading port 20. Further, a cartridge heater 23 is buried in the sidewall of the chamber 2 to heat the sidewall to a temperature such that the source material and the reaction by-product are not attached to the side wall.

A shower head 25 for discharging a processing gas is installed inside the lid 3 through an insulating member 24 to face the stage 10. The shower head 25 includes three disk-shaped plates, i.e. an upper plate 25a, a middle plate 25b, and a lower plate 25c.

The upper plate 25a is a base member of the shower head 25, and a peripheral portion of the middle plate 25b is fixed to a lower peripheral portion of the upper plate 25a by means of screws. A disk-shaped inner heater 26 and a ring-shaped outer heater 27 are disposed at the upper plate 25a. The heaters 26 and 27 are respectively connected to power supplies (not shown).

The lower plate 25c is tightly fixed to a bottom surface of the middle plate 25b by means of screws. An airtight space 28 is formed between a bottom surface of the upper plate 25a and the middle plate 25b. A plurality of recessed portions (spaces) 29 is formed at the bottom surface of the middle plate 25b. The middle plate 25b is provided with a plurality of first gas passages 30 and a second gas passage 31. Each first gas passage 30 is formed of a through-hole which passes through the middle plate 25b, whose top portion communicates with the space 28. The second gas passage 31 is formed substantially at the center of the middle plate 25b, and a lower portion thereof communicates with each space 29.

Disposed through the lower plate 25c is a plurality of first gas discharge holes 33 which communicate with the first gas passages 30 and a plurality of second gas discharge holes 34 which communicate with the spaces 29.

Further, each end portion of a first gas inlet line 35a and a second gas inlet line 35b is coupled to a top surface of the upper plate 25a. The first gas inlet line 35a communicates with the space 28, while the second gas inlet line 35b communicates with the spaces 29 through the second gas passage 31 of the middle plate 25b.

The first and the second gas inlet line 35a and 35b pass through an insulating member 38, which is buried in a recessed portion of the upper plate 25a to cover the heaters 26 and 27, and a gas inlet member 39. The other end portions of the gas inlet lines 35a and 35b are coupled to a gas supply source 40.

The gas supply source 40 includes a $ClF_3$ gas source 41 for supplying a $ClF_3$ gas serving as a cleaning gas; a $TiCl_4$ gas source 42 for supplying a $TiCl_4$ gas serving as a film forming gas; an Ar gas source 43 for supplying an Ar gas serving as a carrier gas; an $H_2$ gas source 44 for supplying an $H_2$ gas serving as a reduction gas; and an $NH_3$ gas source 45 for supplying an $NH_3$ gas for use in nitriding a Ti film. The $ClF_3$ gas source 41, the $TiCl_4$ gas source 42 and the Ar gas source 43 are coupled to the second gas inlet line 35b. On the other hand, the $H_2$ gas source 44 and the $NH_3$ gas source 45 are coupled to the first gas inlet line 35a.

Therefore, gases supplied from the $ClF_3$ gas source 41, the $TiCl_4$ gas source 42 and the Ar gas source 43 pass sequentially through the second gas inlet line 35b, the second gas passage 31 and the space 29, and are discharged to the chamber 2 through the second gas discharge hole 34. Further, gases supplied from the $H_2$ gas source 44 and the $NH_3$ gas source 45 pass sequentially through the first gas inlet line 35a, the space 28 and the first gas passage 30, and are discharged to the chamber 2 through the first gas discharge hole 33. Thereby, the gases supplied through the first gas inlet line 35a and the second gas inlet line 35b are respectively discharged to the chamber 2 without being mixed with each other in the shower head 25.

In the film forming process of the substrate 8, the $TiCl_4$ gas and the $H_2$ gas are supplied to the chamber 2 and then converted into a plasma, thus forming a Ti film on the surface of the substrate 8 through a desirable reaction. In other words, a high-frequency power from a high-frequency power supply 51 is supplied to a power feed rod 52 provided at the shower head 25 to form a high-frequency electric field between the shower head 25 and the mesh electrode 15, thus converting the $TiCl_4$ gas and the $H_2$ gas supplied to the chamber 2 into a plasma and accelerating the Ti film forming reaction. Furthermore, the shower head 25 is cooled by supplying dry air thereto.

Installed on a top surface of the lid 3 are a ring-shaped insulating plate 53 for thermally insulating an upper outer peripheral portion 125 of the shower head 25 and a shield box 54 covering a top portion of the shower head 25. An exhaust port 55 for exhausting dry air supplied to cool the shower head 25 by taking heat from the shower head 25 is disposed at an upper portion of the shield box 54. Herein, the configuration of the CVD film forming apparatus 1 described above is substantially the same as that disclosed in Japanese Patent Laid-open Application No. 2002-327274.

Figure 4:
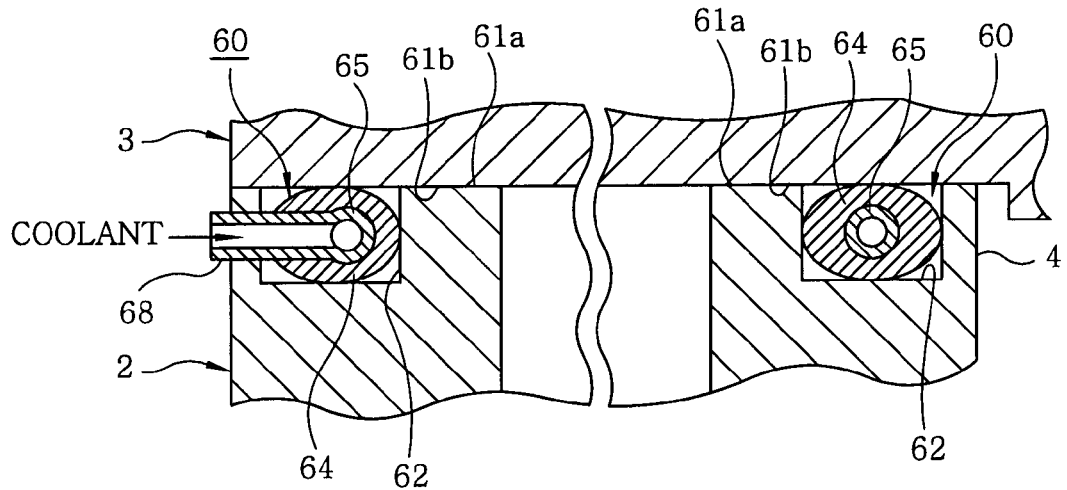
FIG. 4 illustrates an enlarged cross sectional view of the sealing structure shown in FIG. 1.
Figure 5:
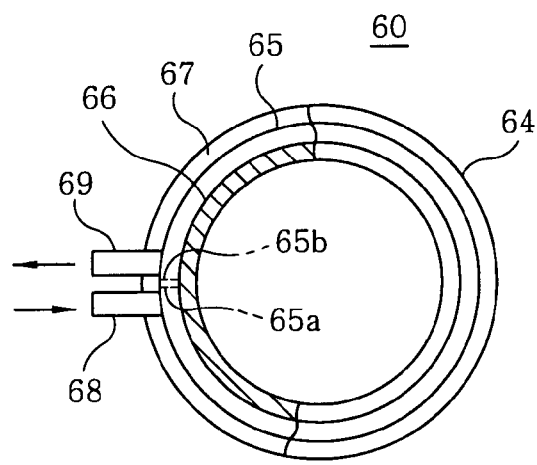
FIG. 5 illustrates a partially cutaway plan view of the sealing structure shown in FIG. 4.
Figure 6:
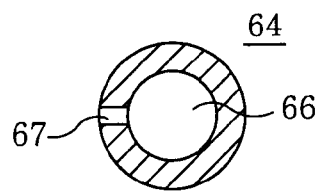
FIG. 6 illustrates a cross sectional view of a sealing member having a slit.

Hereinafter, a sealing structure in accordance with the present invention will be described in detail. As shown in FIGS. 4 to 6, joint surfaces 61a and 61b of the chamber 2 and the lid 3 joined together are air-tightly sealed by a sealing structure 60 of the present invention.

The sealing structure 60 includes an O-ring (sealing member) 64 inserted into a ring-shaped groove 62 formed on the joint surface 61a serving as a top surface of the upper end of the chamber 2 and a cooling pipe 65 for cooling the O-ring 64 from its inside. The O-ring 64 is made of elastic material with excellent heat and corrosion resistance, especially elastomer material, and preferably, fluorine resin. The O-ring 64 has an overall ring shape. Herein, the ring shape does not only mean a perfect circle, but also indicates a closed loop shape such as an elliptical shape, a polygonal shape or the like.

Furthermore, a cavity 66 is formed inside the O-ring 64 along the almost entire periphery. The cavity 66 is opened to the outside through a slit 67 formed along the almost entire periphery of the O-ring 64, and the slit 67 allows insertion of the cooling pipe 65 into the cavity 66 of the O-ring 64 (covering of the cooling pipe 65 with the O-ring 64) and separation of the O-ring 64 from the cooling pipe 65. An outer diameter of the cross-section of the O-ring 64 is greater than the depth of the ring-shaped groove 62 and less than the width of the ring-shaped groove 62.

The cooling pipe 65 is preferably made of metal and its outer diameter is substantially the same as a diameter of the cavity 66 of the O-ring 64. The cooling pipe 65 has a coolant supply port 68 and a coolant discharge port 69. The coolant supply port 68 is connected to a coolant supply source (not shown), and the coolant discharge port 69 leads to the outside of the CVD film forming apparatus 1. As the coolant supplied to the cooling pipe 65, room temperature air, cold air, room temperature water, cold water or the like can be used. In order to ensure that the coolant unidirectionally flows in the cooling pipe 65, i.e., from the coolant supply port 68 to the coolant discharge port 69, a coolant passageway in the cooling pipe 65 has a discontinuous part between the coolant supply port 68 and the coolant discharge port 69 (between dashed lines 65a and 65b shown in FIG. 5). The discontinuous part can be formed by installing a partition member between each part indicated by the dashed lines 65a and 65b of the cooling pipe 65. On the other hand, the discontinuous part can be formed by removing the part between the dashed lines 65a and 65b of the cooling pipe 65 and blocking each part indicated by the dashed line 65a or 65b.

In order to insert the cooling pipe 65 into the O-ring 64, the O-ring 64 is elastically deformed to extend the slit 67 and thereby the cooling pipe 65 can be pushed inside the cavity 66 of the O-ring 64. After the cooling pipe 65 is completely pushed in the cavity 66, the external force is removed from the O-ring 64, and the O-ring 64 is then restored to the original shape in such a manner that an inner peripheral surface of the O-ring 64 is adhered to an outer peripheral surface of the cooling pipe 65. In this state, the O-ring 64 with the cooling pipe 65 is mounted into the ring-shaped groove 62, the lid 3 is installed on the joint surface 61a of the chamber 2, and the lid 3 is fixed to the chamber 2 by means of bolts or the like. Thereby, the joint surface 61b, i.e. a bottom surface of the lid 3, presses the O-ring 64, and the O-ring 64 is elastically deformed to an elliptical shape. That is, a bottom surface of the O-ring 64 is brought into pressurized contact with a bottom surface of the ring-shaped groove 62, and both side surfaces of the O-ring 64 are brought into pressurized contact with both sidewalls of the ring-shaped groove 62, whereby a gap between the chamber 2 and the lid 3 is air-tightly sealed. When the chamber 2 is vacuum-evacuated and a Ti film is formed on the surface of the substrate 8, the O-ring 64 is cooled from its inside by coolant fed through the cooling pipe 65.

In accordance with the present invention, since permeability of a gas permeating a solid depends on the temperature, the O-ring 64 is cooled by the coolant supplied through the cooling pipe 65 when the film forming process is performed on the substrate 8 using the CVD film forming apparatus 1. In this manner, the amount of oxygen permeating the O-ring 64 can be extremely small to thereby reduce the amount of oxygen penetrating through the chamber 2. Accordingly, the interior of the chamber 2 can be maintained at a stable vacuum level.

Furthermore, the O-ring 64 is inexpensive compared to the metallic sealing member, does not damage a sealing surface of the joint surfaces 61a and 61b in spite of expansion and contraction due to the temperature variation, and can be used repeatedly.

Further, since the O-ring 64 is detachably attached to the outer periphery of the cooling pipe 65, it can be easily replaced with a new O-ring if it is deteriorated with an elapse of time.

Moreover, since the O-ring is cooled from its inside, only the O-ring 64 can be cooled locally, and thus, the cooling of the O-ring 64 does not influence temperature controls of other parts of the CVD film forming apparatus 1.

Figure 7:
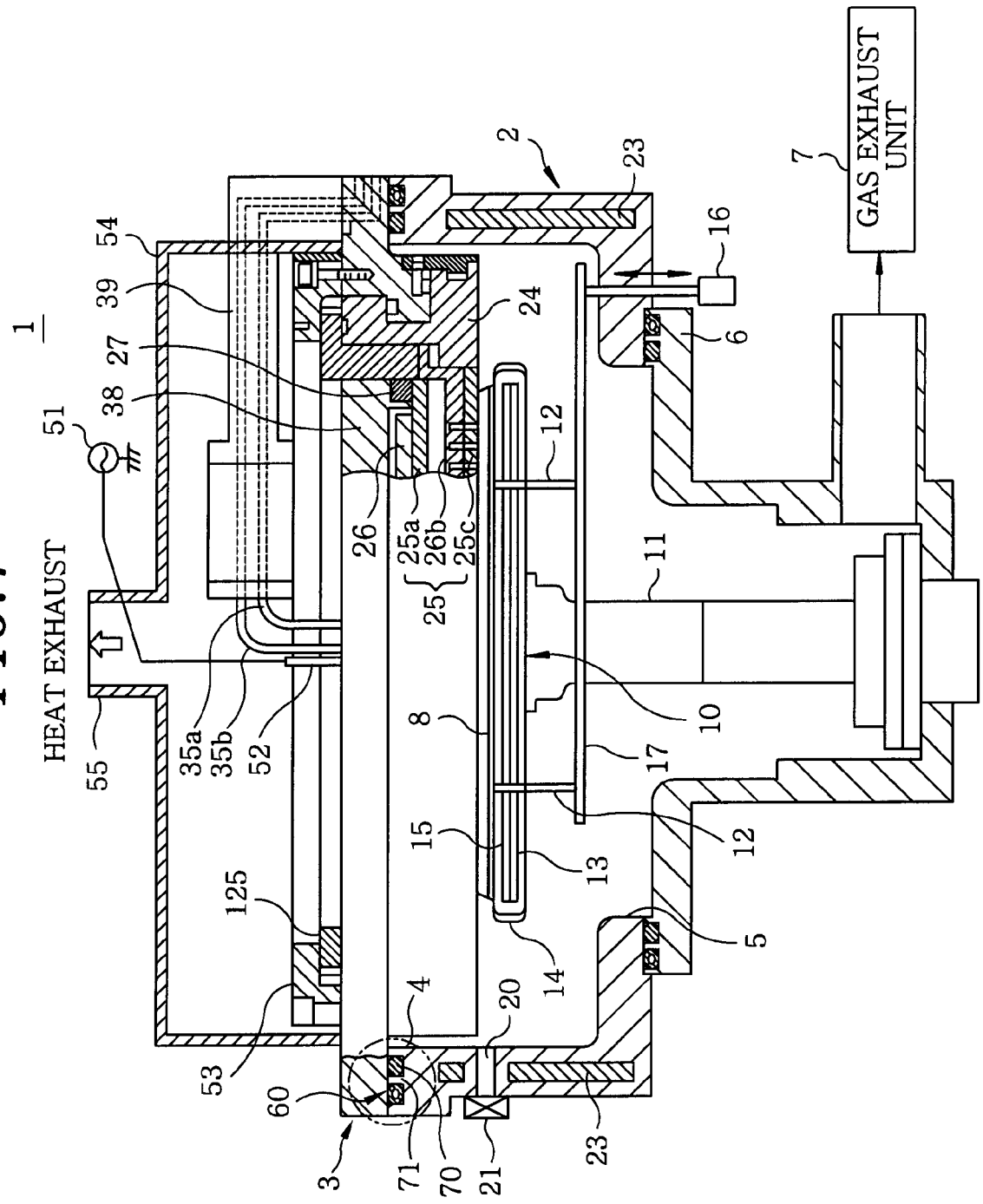
FIG. 7 illustrates a cross sectional view of a CVD film forming apparatus with a sealing structure in accordance with preferred embodiment of the present invention.
Figure 8:
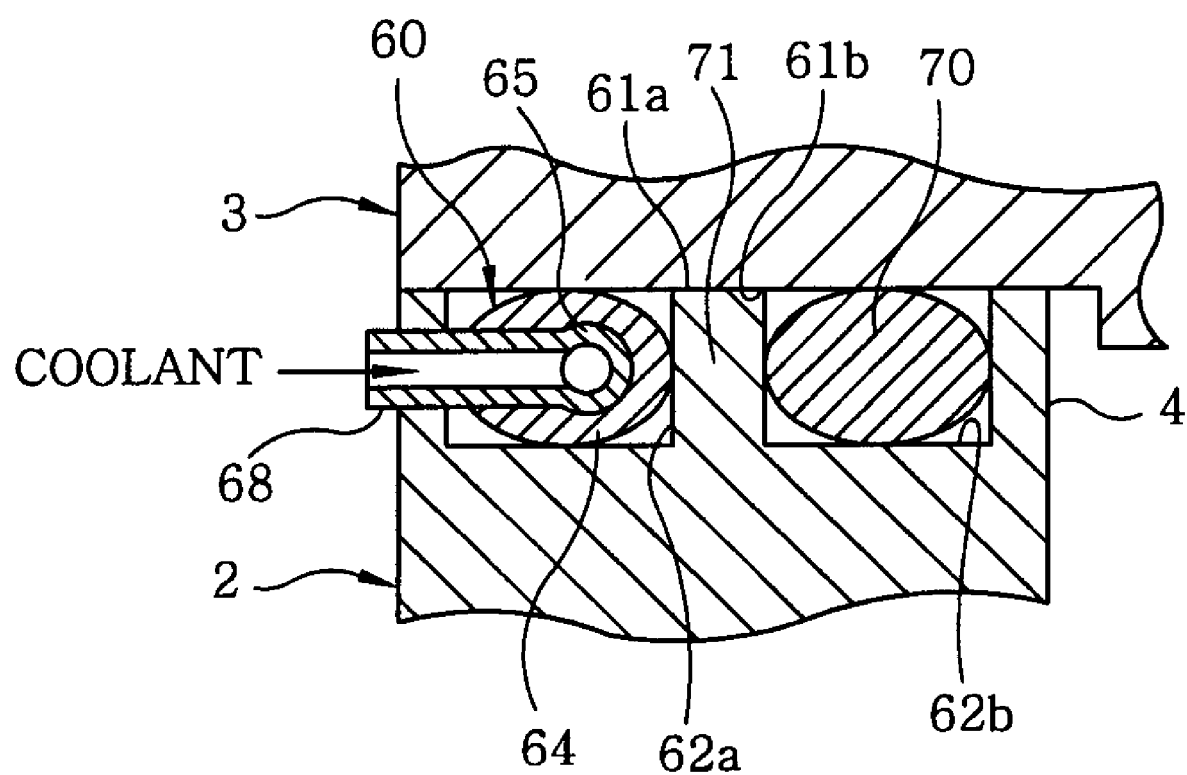
FIG. 8 illustrates an enlarged cross sectional view of a part of FIG. 7.

Next, referring to FIGS. 7 and 8, a sealing structure in accordance with another embodiment of the present invention will be described. In this embodiment, in particular, as shown in FIG. 8, two ring-shaped grooves 62a and 62b are formed at the joint surface 61a of the chamber 2. The O-ring 64 in which the cooling pipe 65 shown in FIG. 4 is buried is pushed inside the outer ring-shaped groove 62a, and a typical solid O-ring 70 (without a cavity) is pushed in the inner ring-shaped groove 62b, so that a gap between the chamber 2 and the lid 3 can be air-tightly sealed by the two O-rings 64 and 70. The O-ring 70 has an overall ring shape, and made of elastic material, especially elastomer such as rubber, fluorine resin or the like. The two ring-shaped grooves 62a and 62b are partitioned by a partition wall 71. Further, the CVD film forming apparatus 1 shown in FIG. 7 is the same as that shown in FIG. 1 except the sealing structure, and therefore, a redundant explanation thereof will be omitted.

The sealing structure of FIG. 8 has the advantage over that of FIG. 4 in the case where a process gas which is liquefied or generates product when cooled is used in the chamber 2. That is, in the sealing structure shown in FIG. 4, since the process gas which penetrates from the chamber 2 into the gap between the joint surfaces 61a and 61b first meets the cooled O-ring 64, the liquefied process gas or product generated by the process gas can be attached to the surface of the O-ring 64. However, in the sealing structure shown in FIG. 8, since the process gas penetrating from the chamber 2 into the gap between the joint surfaces 61a and 61b first meets the inner O-ring 70 which is not cooled, the above-described problem does not occur. Further, the cooled outer O-ring 64 prevents oxygen from penetrating from the outside into the chamber 2. Furthermore, since the O-ring 70 is separated from the O-ring 64 by the partition wall 71, the O-ring 70 is prevented from being cooled by the cooling of the O-ring 64, and thus the attachment of product caused by the process gas to the O-ring 70 can be also prevented.

The sealing structure in accordance with the present invention is not limited to the above-described CVD film forming apparatus, and it can also be applied to various vacuum devices, e.g., a heat treatment apparatus for performing numerous heat treatments such as an oxidation/diffusion process, a quality modification process, an annealing process or the like.

While the invention has been shown and described with respect to the embodiments, it will be understood by those skilled in the art that various changes and modifications may be made without departing from the scope of the invention as defined in the following claims.

What is claimed is:

1. A sealing structure of a vacuum device comprising:
   a vacuum container, into which a processing gas is supplied, for accommodating therein a target object;
   a closing member for closing an opening port of the vacuum container;
   a first ring-shaped sealing member made of elastomer, which is interposed between the vacuum container and the closing member in an elastically deformed state to airtightly seal a gap between the vacuum container and the closing member; and
   a second ring-shaped sealing member interposed between the vacuum container and the closing member and arranged closer to an inner space of the vacuum container than the first sealing member,
   wherein a cavity is formed in the first sealing member along a circumferential direction thereof, and a cooling pipe in which a coolant circulates is inserted in the cavity,
   wherein a cooling pipe is not inserted in the second ring-shaped sealing member,
   wherein the first sealing member is configured to be cooled by the coolant, such that a gas permeability of the first sealing member is lowered and a gas outside the vacuum container is prevented from penetrating into the vacuum container,
   wherein the second sealing member is separated from the first sealing member by a partition wall such that the second sealing member is prevented from being cooled by the first sealing member, and
   wherein the second sealing member is configured to be not cooled and to prevent the processing gas inside the vacuum container from contacting with the first sealing member, such that the processing gas or product generated by the processing gas is prevented from being cooled and attached to a surface of the first sealing member.

2. The sealing structure of claim 1, wherein a slit is formed at the first sealing member to attach or detach the cooling pipe to or from the first sealing member.

3. The sealing structure of claim 1, wherein the first sealing member is made of a fluorine resin.

4. The sealing structure of claim 1, wherein the first sealing member and the second sealing member are, respectively, accommodated in two ring-shaped grooves formed in the vacuum container or the closing member, and the ring-shaped grooves are partitioned from each other by the partition wall.

5. The sealing structure of claim 4, wherein the ring-shaped grooves include an inner and an outer ring-shaped groove and the first sealing member is accommodated in the outer ring-shaped groove, while the second sealing member is accommodated in the inner ring-shaped groove.

6. The sealing structure of claim 1, wherein the first and the second sealing member are accommodated in an outer and an inner ring-shaped groove formed in the vacuum container and/or the closing member.

7. The sealing structure of claim 6, wherein the first sealing member is accommodated in the outer ring-shaped groove and the second sealing member is accommodated in the inner ring-shaped groove.

8. The sealing structure of claim 7, wherein the partition wall is disposed between the inner and the outer ring-shaped groove to suppress the second sealing member from being cooled by the first sealing member.

9. The sealing structure of claim 8, wherein the second sealing member is of a solid sealing member without a cavity therein so that no cooling pipe is inserted therein.

10. The sealing structure of claim 7, wherein the second sealing member is of a solid sealing member without a cavity therein so that no cooling pipe is inserted therein.

11. The sealing structure of claim 6, wherein the partition wall is disposed between the inner and the outer ring-shaped groove to suppress the second sealing member from being cooled by the first sealing member.

12. The sealing structure of claim 11, wherein the second sealing member is of a solid sealing member without a cavity therein so that no cooling pipe is inserted therein.

13. The sealing structure of claim 6, wherein the second sealing member is of a solid sealing member without a cavity therein so that no cooling pipe is inserted therein.

14. The sealing structure of claim 1, wherein the second sealing member is of a solid sealing member without a cavity therein so that no cooling pipe is inserted therein.

15. The sealing structure of claim 1, wherein a sidewall of the vacuum container is heated by a heater such that a source material and a reaction by-product are not attached to the sidewall.

* * * * *